US007001818B2

(12) United States Patent
Tsuchiya et al.

(10) Patent No.: US 7,001,818 B2
(45) Date of Patent: Feb. 21, 2006

(54) MIS SEMICONDUCTOR DEVICE AND MANUFACTURING METHOD THEREOF

(75) Inventors: Ryuta Tsuchiya, Mitaka (JP); Masatada Horiuchi, Koganei (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/825,163

(22) Filed: Apr. 16, 2004

(65) Prior Publication Data

US 2004/0207013 A1    Oct. 21, 2004

Related U.S. Application Data

(63) Continuation of application No. 10/372,329, filed on Feb. 25, 2003, now Pat. No. 6,744,099.

(30) Foreign Application Priority Data

May 22, 2002    (JP)    ............................ P2002-147237

(51) Int. Cl.
  *H01L 21/336*    (2006.01)

(52) U.S. Cl. ...................... 438/303; 438/305; 438/306; 438/307; 438/595

(58) Field of Classification Search ................ 438/303, 438/305, 306, 307, 595
See application file for complete search history.

(56) References Cited

U.S. PATENT DOCUMENTS

| 5,234,850 | A | * | 8/1993 | Liao .......................... 438/231 |
| 5,824,588 | A | * | 10/1998 | Liu ............................. 438/302 |
| 6,043,545 | A | * | 3/2000 | Tseng et al. ................ 257/408 |
| 6,344,677 | B1 | * | 2/2002 | Higuchi ...................... 257/408 |
| 6,399,451 | B1 | | 6/2002 | Lim et al. |
| 6,448,167 | B1 | * | 9/2002 | Wang et al. ................ 438/595 |
| 6,661,067 | B1 | | 12/2003 | Ngo et al. |

FOREIGN PATENT DOCUMENTS

| JP | 5-3206 | 1/1993 |
| JP | 7-245391 | 9/1995 |

* cited by examiner

*Primary Examiner*—Trung Dang
(74) *Attorney, Agent, or Firm*—Mattingly, Stanger, Malur & Brundidge, P.C.

(57) ABSTRACT

By suppressing a short-channel effect of a MIS field-effect transistor and reducing a fringing capacitance of a gate, a signal delay in the transistor can be shortened. The MIS field-effect transistor is formed d by forming a side-wall spacer from a dielectric having a large dielectric constant and then forming an impurity diffusion layer area with the side-wall spacer used as an introduction end in an ion implantation process to introduce impurities. In this case, the side wall of the side-wall spacer having the large dielectric constant has an optimum film thickness in the range from 5 nm to 15 nm, which is required for achieving a large driving current. On the other hand, a side-wall spacer on an outer side is made of a silicon-dioxide film, which is a dielectric having a small dielectric constant.

7 Claims, 9 Drawing Sheets

MIS SEMICONDUCTOR DEVICE AND MANUFACTURING METHOD THEREOF

This is a continuation application of U.S. Ser. No. 10/372,329, filed Feb. 25, 2003 now U.S. Pat. No. 6,744,099.

BACKGROUND OF THE INVENTION

1. Field of the Invention

In general, the present invention relates to a semiconductor device and a manufacturing method thereof. More particularly, the present invention relates to enhancement of an operating current of a super-miniaturized MIS semiconductor device and super enhancement of an operating speed of the MIS semiconductor device.

2. Description of the Related Art

Enhancement of performance of an insulated-gate field-effect transistor or, in particular, a MIS field-effect transistor (hereinafter, simply abbreviated to MISFET) employed in a super-density semiconductor device is based on a scaling law and has been successful. The success of the enhancement of an insulated-gate field-effect transistor's performance is attributed to a decrease in applied power-supply voltage, a decrease in transistor area and miniaturization of gate dimensions. The decrease in transistor area and the miniaturization of gate dimensions should provide a merit of a decrease in parasitic capacitance.

If the gate dimensions are decreased, however, a short-channel effect is resulted in, causing a threshold voltage to fluctuate. In order to reduce the short-channel effect accompanying miniaturization of the length of the gate electrode in the super miniaturized MIS described above, an effort to make a junction of a source diffusion layer and a drain diffusion layer shallow is promoted.

Even in the case of a MISFET with a shallow junction of the source diffusion layer and the drain diffusion layer, as the device is miniaturized to reach a gate length equal to or smaller than 100 nm, it becomes difficult to assure a large effective channel length because of the existence of an overlap area between the gate and the source/drain diffusion layers and, hence, hard to suppress the short-channel effect This overlap area is generated due to diffusion of impurities during a heat treatment carried out for the purpose of activating the impurities.

In order to solve the problems described above, in accordance with a typical solution disclosed in Japanese Patent Laid-open No. H7(1995)-245391, after a first side-wall spacer is provided on a side wall of the gate electrode, impurities are introduced with the gate electrode and the first side-wall spacer used as masks to form an N- or P-source diffusion layer area and a drain diffusion layer area. As a result, it is possible to form an effective structure in which a large effective gate length is assured.

In addition, in accordance with a disclosure described in Japanese Patent Laid-open No. H5(1993)-3206 as a typical means for suppressing an increase in source/drain parasitic resistance, a first side-wall spacer is used as a material with a dielectric constant greater than that of an oxide layer. In addition, an electric field in an N- or P-area of source/drain region at the gate edge is strengthened so as to reduce the resistance of a parasitic resistance under the first side-wall spacer. Thus, an effective result of an increased driving current can be obtained.

SUMMARY OF THE INVENTION

In the structure disclosed in Japanese Patent Laid-open No. Hei7-245391, the concentration of impurities in the N- or P-area of the gate edge is low in comparison with a concentration, which is obtained when a diffusion layer area is formed with only the ordinary gate electrode used as a mask. Thus, the resistance of a source/drain parasitic resistance increases, giving rise to a demerit of a deteriorating driving power.

In addition, the structure disclosed in Japanese Patent Laid-open No. Hei5-3206 is limited to an offset gate structure including a portion in which the gate electrode and the source/drain diffusion layer areas do not overlap each other.

In the case of the offset gate structure, a channel resistance of an offset area has a very high resistance value. Thus, even if a material having a high dielectric constant is used for making the first side-wall spacer, it is difficult to obtain a sufficient high driving current.

Furthermore, if all materials used for making the first side-wall spacer have a high dielectric constant as described above, the fringing capacitance of the gate will increase, raising a problem of an extremely long signal delay.

As described above, with the conventional technologies, it is difficult to suppress the short-channel effect and to assure a large driving current at the same time.

It is thus an object of the present invention addressing the problems described above to provide a MIS semiconductor device that is excellent in that the short-channel effect can be suppressed and, at the same time, a large driving current can be assured, and to provide a method of manufacturing the MIS semiconductor device. Further, it is an object of the present invention to provide a MIS semiconductor device and its manufacturing method which realize a reduction of the fringing capacitance of the gate and speeding-up of the signal delay.

The present invention is based on a result of a discovery of the new phenomenon in a study of an optimum condition for structures of a source region and a drain region in the MIS semiconductor device. Details of the present invention are described as follows.

Figure 3:
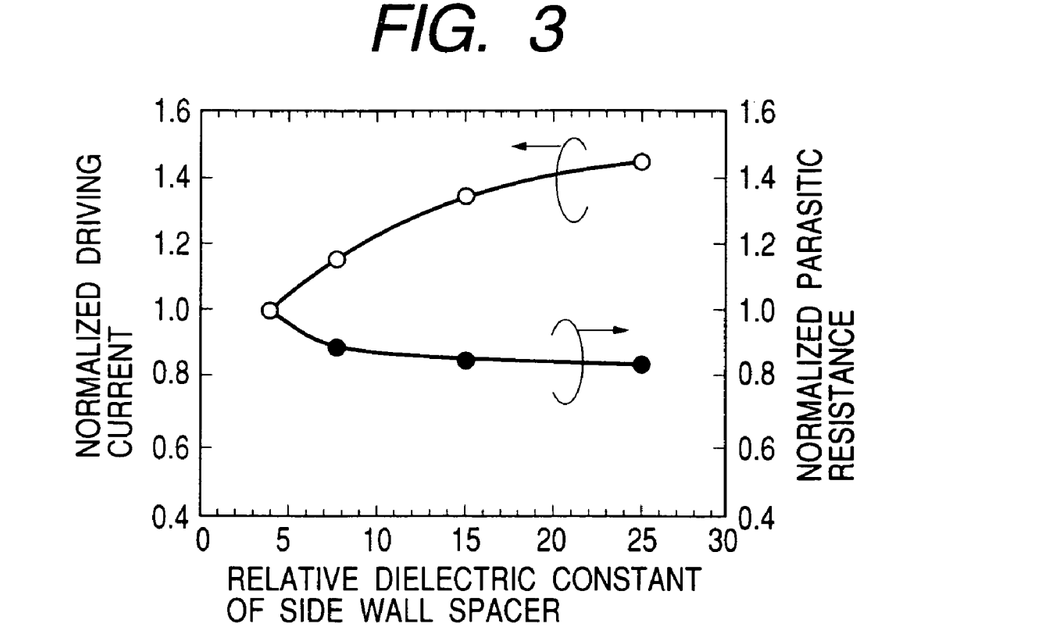
FIG. 3 is a diagram showing a relation between the relative dielectric constant of a dielectric used for making a side-wall spacer and a driving current as well as a relation between the relative dielectric constant and a parasitic resistance.

FIG. 3 is a diagram showing changes in transistor driving current and transistor parasitic resistance, which were obtained by simulation when the relative dielectric constant of a dielectric used for making the first side-wall spacer was varied. The values are normalized on the basis of the value of a silicon-oxide film with a relative dielectric constant of 3.9. The larger becomes the relative dielectric constant, the smaller the parasitic resistance and, hence, the driving current becomes larger.

Figure 4:
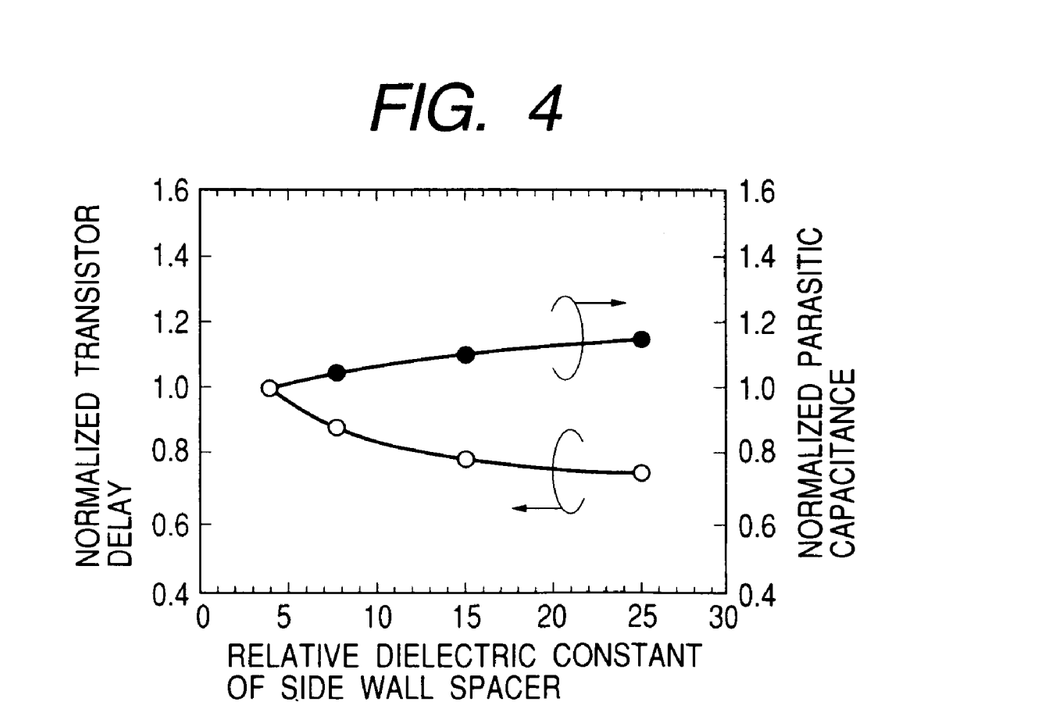
FIG. 4 is a diagram showing a relation between the relative dielectric constant of a dielectric used for making a side-wall spacer and a transistor delay as well as a relation between the relative dielectric constant and a parasitic capacitance.

On the other hand, FIG. 4 is a diagram showing changes in transistor delay and transistor parasitic capacitance, which were obtained when the relative dielectric constant of a dielectric used for making the first side-wall spacer was varied. The values are normalized on the basis of the value of a silicon-oxide film with a relative dielectric constant of 3.9 as is the case with the values shown in FIG. 3. The larger the relative dielectric constant, the smaller the transistor delay. This is because, for a large relative dielectric constant, the effect of an increased driving current is greater than the effect of an increased parasitic capacitance value. That is, the larger becomes the relative dielectric constant of a dielectric used for making the first side-wall space, the higher the possibility of a high-speed operation of the transistor.

Figure 5:
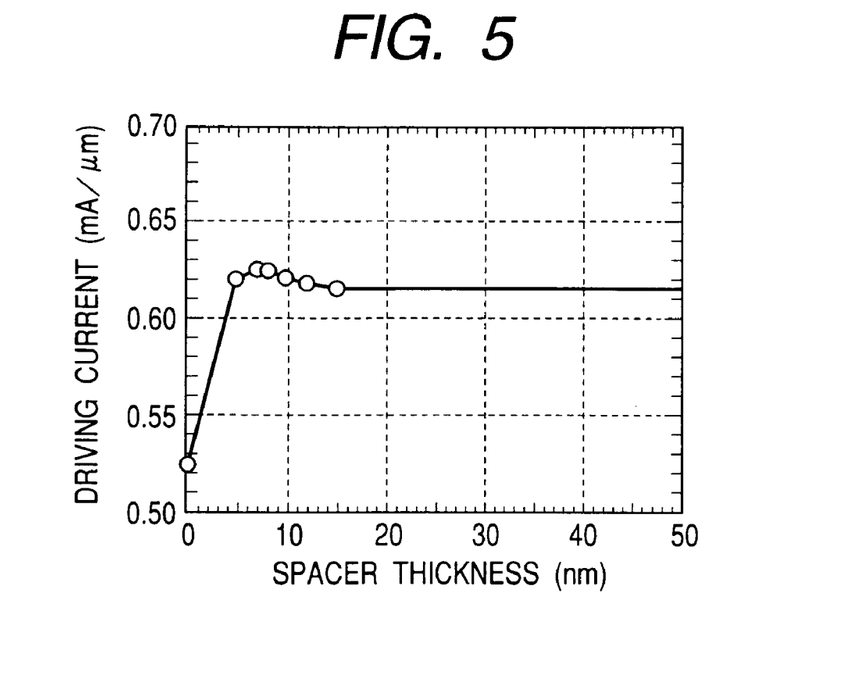
FIG. 5 is a diagram showing a relation between the thickness of a film used for making a side-wall spacer and a driving current of a transistor.

FIG. 5 is a diagram showing changes in driving current, which were obtained when the width of the first side-wall spacer was varied. The driving current increases as the width of the first side-wall spacer increases. As the width of the first side-wall spacer reaches a value close to 7 nm, the driving current reaches a maximum value. When the width of the first side-wall spacer is further increased, and it exceeds 15 nm, the driving current stays at a constant.

The present invention is based on a result of a discovery of the new phenomenon in a study of an optimum condition for structures of a source diffusion layer and a drain diffusion layer in the MIS semiconductor device.

In order to achieve the object described above, the present invention provides a MIS semiconductor device and a method of manufacturing the MIS semiconductor device.

The MIS semiconductor device provided by the present invention is characterized in that the MIS semiconductor device comprises:

a gate dielectric formed on a semiconductor substrate of a first conduction type;

a gate electrode provided on the top surface of the gate dielectric;

a first side-wall spacer formed in a state of being brought into contact with the surface of the semiconductor substrate spread over the side wall and outer circumference of the gate electrode;

a first impurity area formed by introduction of first impurities having a conduction type opposite to the first conduction type into the semiconductor substrate with the gate electrode and the first side-wall spacer used as masks;

a second side-wall spacer formed by placing a material on a side wall of the first side-wall spacer; and a second impurity area, which has an impurity concentration higher than an impurity concentration of the first impurity area and is formed by introduction of the first impurities into the semiconductor substrate with the gate electrode, the first side-wall spacer and the second side-wall spacer used as masks, wherein:

the first side-wall spacer has a relative dielectric constant greater than that of the second side-wall spacer for a predetermined width; and one edge of the gate electrode overlaps on the first impurity area.

Moreover, the MIS semiconductor device is further characterized in that the first side-wall spacer has a predetermined width in the range from 5 nm to 15 nm.

The MIS semiconductor device is further characterized in that the first side-wall spacer is made of a material, which can be one selected from silicon nitride, silicon, aluminum oxide, tantalum oxide, titanium oxide, zirconium dioxide and hafnium oxide.

In addition, the MIS semiconductor device is further characterized in that a dielectric is formed between the first side-wall spacer and the upper surface of the semiconductor substrate and the gate electrode.

Furthermore, the MIS semiconductor device is further characterized in that the first side-wall spacer is made of a thin film extended over the upper surface of the semiconductor substrate.

On the other hand, the method of manufacturing the MIS semiconductor device provided by the present invention is characterized in that the MIS-semiconductor-device-manufacturing method comprises:

a process of creating a gate dielectric on a semiconductor substrate of a first conduction type and providing a gate electrode on the top surface of the gate dielectric;

a process of creating a first side-wall spacer in a state of being brought into contact with the surface of the semiconductor substrate spread over the side wall and outer circumference of the gate electrode by placing a dielectric for a predetermined width;

a process of formation of a first impurity area by introduction of first impurities having a conduction type opposite to the first conduction type into the semiconductor substrate with the gate electrode and the first side-wall spacer used as masks;

a process of formation of a second side-wall spacer by placing a dielectric material on the first side-wall spacer;

a process of formation of a second impurity area having an impurity concentration higher than that of the first impurity area by introduction of the first impurities into the semiconductor substrate with the gate electrode, the first side-wall spacer and the second side-wall spacer used as masks, in addition, the MIS-semiconductor-device-manufacturing method is further characterized in that the first side-wall spacer is made of a material having a relative dielectric constant greater than that of the second side-wall spacer; and a process of carrying out a heat treatment on the first impurity area to overlap one edge of the gate electrode on the first side-wall spacer.

Furthermore, the MIS-semiconductor-device-manufacturing method is further characterized in that the second side-wall spacer is made of a silicon-oxide film.

Moreover, the MIS-semiconductor-device-manufacturing method is further characterized in that the first side-wall spacer is made of a thin film having a fixed thickness.

DESCRIPTION OF THE PREFERRED EMBODIMENT

Embodiments of the present invention are described in more detail. In order to make the description easy to understand, the embodiments are explained by referring to the diagrams. A portion of interest may be shown in a figure with a size greater size than those of other portions. It is to be noted that items such as a property, a conduction type and a manufacturing condition, which are related to any portion, are not limited to those described in the embodiments. That is, it is needless to say that a variety of modifications are possible.

Figure 1:
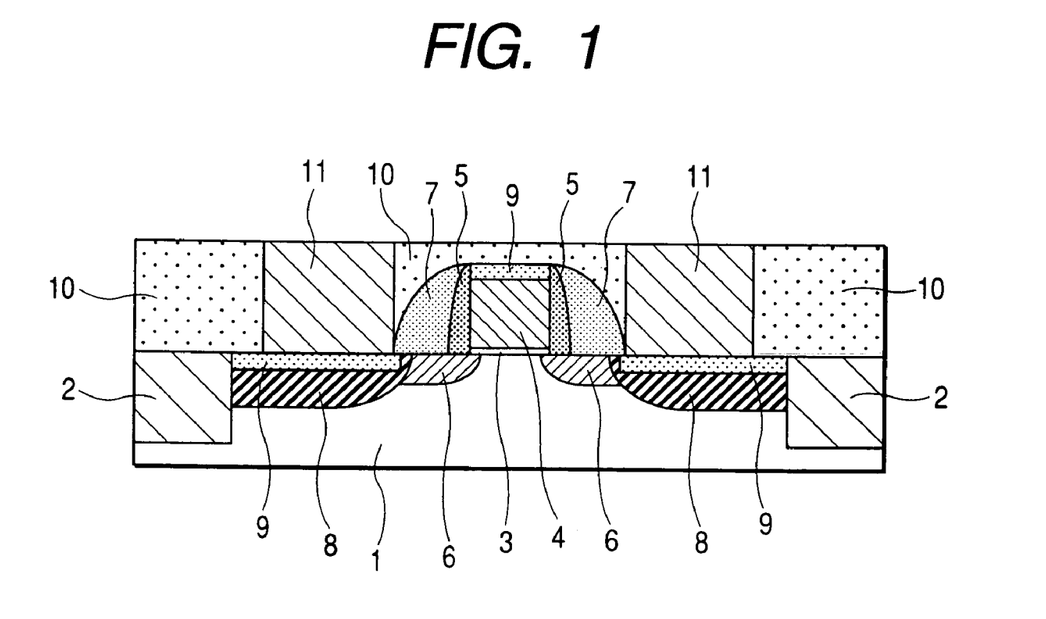
FIG. 1 is a complete cross-sectional diagram showing a MIS field-effect transistor implemented by a first embodiment of the present invention.

FIG. 1 is a complete cross-sectional diagram showing a MIS field-effect transistor implemented by a first embodiment of the present invention and FIG. 2 is an explanatory diagram showing a process of fabricating the MIS field-effect transistor implemented by the first embodiment.

Figure 2A:
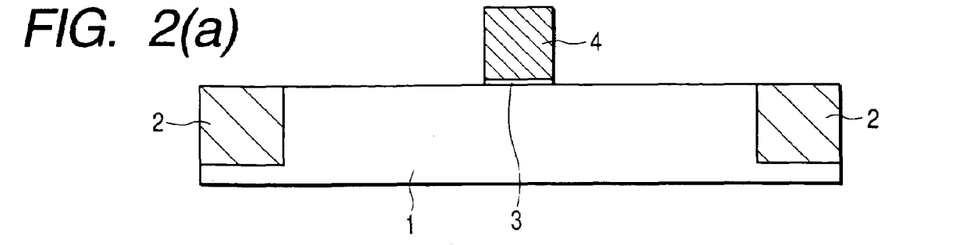
FIG. 2 is an explanatory diagram showing a process of fabricating the MIS field-effect transistor implemented by the first embodiment.

The fabrication process is explained by referring to FIG. 2 as follows. As shown in FIG. 2(a), a gate dielectric 3 and a gate electrode 4 made of poly-silicon are formed on a silicon substrate 1. Then, a dielectric which has a dielectric constant greater than a silicon-oxide film, for example, a silicon-nitride film or a titanium-oxide film, is deposited on the silicon substrate 1 by adopting typically a CVD (Chemical Vapor Deposition) technique. The dielectric is then etched back to leave a first side-wall spacer 5 on the side wall of the gate electrode 4. At that time, in order to assure reliability of the device, light oxidation is carried out at a temperature of typically 650° C. prior to the process to stack the first side-wall spacer 5 on the silicon substrate 1 in order to cover the surface of the silicon substrate 1 and the surface of the gate electrode 4 with an extremely thin silicon-oxide film.

Figure 2B:
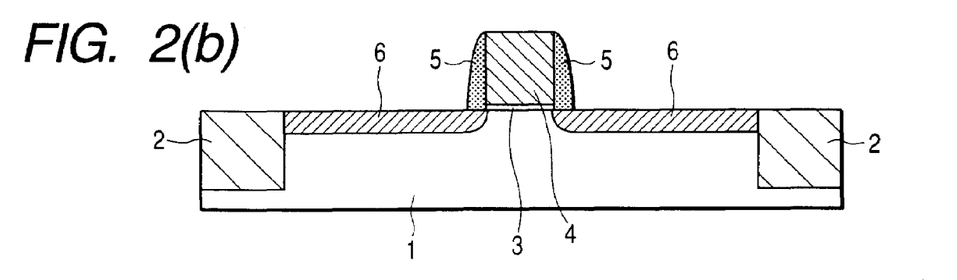
Figure 2C:
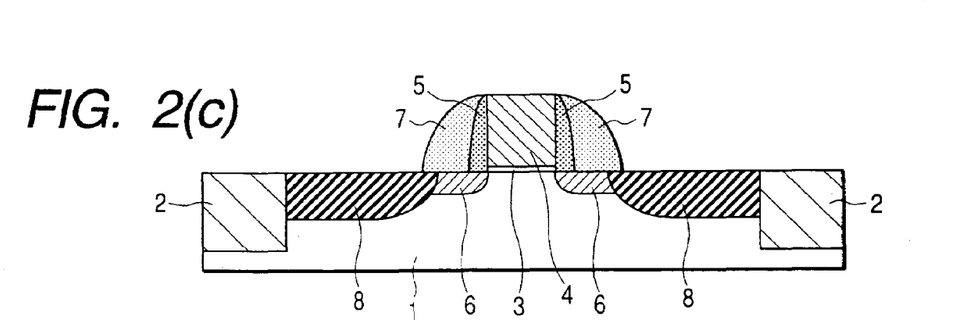

Then, a first impurity diffusion layer area 6 formed on the silicon substrate 1 by ion implantation of impurities having a predetermined conduction type with the side-wall spacer 5 used as a mask as shown in FIG. 2(b). Subsequently, another dielectric whose dielectric constant is smaller than the first side-wall spacer 5, for example, a silicon-oxide film, is stacked on the silicon substrate 1 by adopting typically the CVD technique. In the same way, the other dielectric is then etched back to leave a second side-wall spacer 7. Then, a second impurity diffusion layer area 8 is formed on the silicon substrate 1 by ion implantation of impurities having a high concentration with the gate electrode, the first side-wall spacer and the second side-wall spacer 7 used as a mask as shown in FIG. 2(c).

Figure 2D:
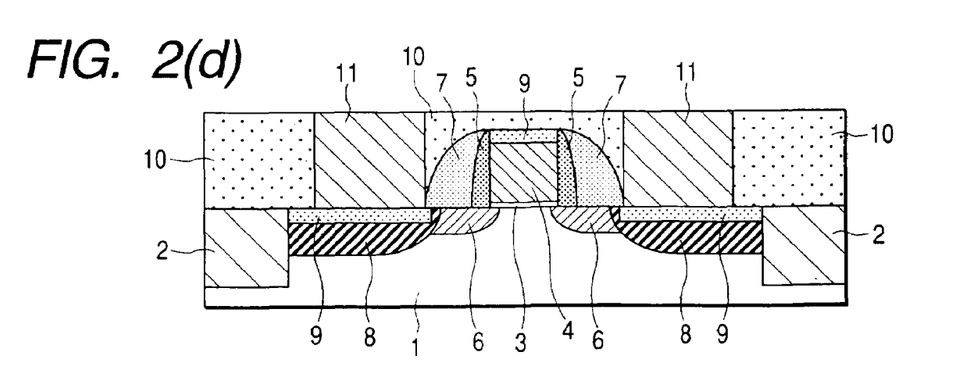

Then, an activation annealing process is carried out on the impurities at a typical temperature of over 1,000° C. in a period of time as short as possible. By shortening the thermal budget in this way, desirable suppression of impurity diffusion can be carried out. Subsequently, on the surface layer of the second impurity diffusion layer area 8 and the surface layer of the gate electrode 4, a metal silicide layer 9 is formed. Examples of the metal silicide are titanium silicide, cobalt silicide and nickel silicide. Then, after the metal silicide layer is formed, an interlayer dielectric 10 and wiring electrodes 11 including drain and source electrodes are formed in accordance with a desired circuit technique as shown in FIG. 2(d).

In accordance with this embodiment, the first impurity diffusion layer area 6 is formed with the first side-wall spacer 5 used as a mask. Thus, spreading of the diffusion layer area into the channel in the horizontal direction can be suppressed so that a large effective channel length can be assured. As a result, the device can be miniaturized and the short-channel effect can be suppressed even for a gate length smaller than the gate length provided by the conventional technology.

In addition, an inner side wall of the gate electrode 3 is made of a film having a large dielectric constant. Thus, an electric field applied to the silicon substrate 1 beneath the first side-wall spacer 5 is very strong. As a result, the impurity area beneath the first side-wall spacer 5 can be inverted sufficiently. Therefore, even if the size of an overlap area between the gate and the source/drain diffusion layers is small, an increase in parasitic resistance can be suppressed so that a sufficient driving current can be flown. As a result, it is possible to suppress the short-channel effect and to assure a large driving current at the same time.

FIG. 3 is a diagram showing changes in transistor driving current and transistor parasitic resistance, which were obtained by simulation when the relative dielectric constant of a dielectric used for making the first side-wall spacer was varied. The values are normalized on the basis of the value of a silicon-oxide film with a relative dielectric constant of 3.9. Due to the effect described above, the larger becomes the relative dielectric constant, the smaller the parasitic resistance and, hence, the driving current becomes larger.

On the other hand, FIG. 4 is a diagram showing changes in transistor delay and transistor parasitic capacitance, which were obtained when the relative dielectric constant of a dielectric used for making the first side-wall spacer was varied. The values are normalized on the basis of the value of a silicon-oxide film with a relative dielectric constant of 3.9 as is the case with the values shown in FIG. 3. The larger becomes the relative dielectric constant, the larger the parasitic capacitance. This is because, for a large relative dielectric constant, the effect of an increased driving current is greater than the effect of an increased parasitic capacitance value. That is, the larger becomes the relative dielectric constant of a dielectric used for making the first side-wall space, the higher the possibility of a high-speed operation of the transistor.

As described above, the first side-wall spacer 5 formed by etching back a dielectric such as a silicon-nitride layer or a titanium-oxide layer. The width of the first side-wall spacer 5 is thus determined by the deposit thickness of the dielectric. In addition, the width of the first side-wall spacer 5 is also obtained as a result of suppression of spreading of the first impurity diffusion layer area 6 into the channel in the horizontal direction. As for its film thickness, in a process step of ion implantation of impurities it is, strictly speaking, necessary to set an ion implantation energy by considering conditions such as a dose and thermal diffusion caused by a subsequent annealing process.

From a standpoint of suppression of the short-channel effect, it is desirable to increase the width of the first side-wall spacer 5. From the parasitic-capacitance point of view, on the other hand, it is desirable to decrease the width of the first side-wall spacer 5 to as much a value as possible.

In addition, at that time, a diffusion coefficient for As ions generally used in the creation of the first impurity diffusion layer area 6 of an N-type transistor is different from a diffusion coefficient for B ions generally used in the creation of the first impurity diffusion layer area 6 of a P-type transistor. Thus, an optimum value for an N transistor is different from that for a P transistor. Taking these facts into consideration, it is necessary to set an optimum value of the width of the first side-wall spacer 5.

FIG. 5 is a diagram showing changes in driving current, which were obtained when the width of the first side-wall spacer was varied. The driving current increases as the width of the first side-wall spacer increases. As the width of the first side-wall spacer reaches a value close to 7 nm, the driving current reaches a maximum value. When the width of the first side-wall spacer is further increased, and it exceeds 15 nm, the driving current stays at a constant. From the above point of view, the width of the first side-wall spacer 5 has an optimum value. The first side-wall spacer 5 is formed at a width in the range from 5 nm to 15 nm.

Figure 6:
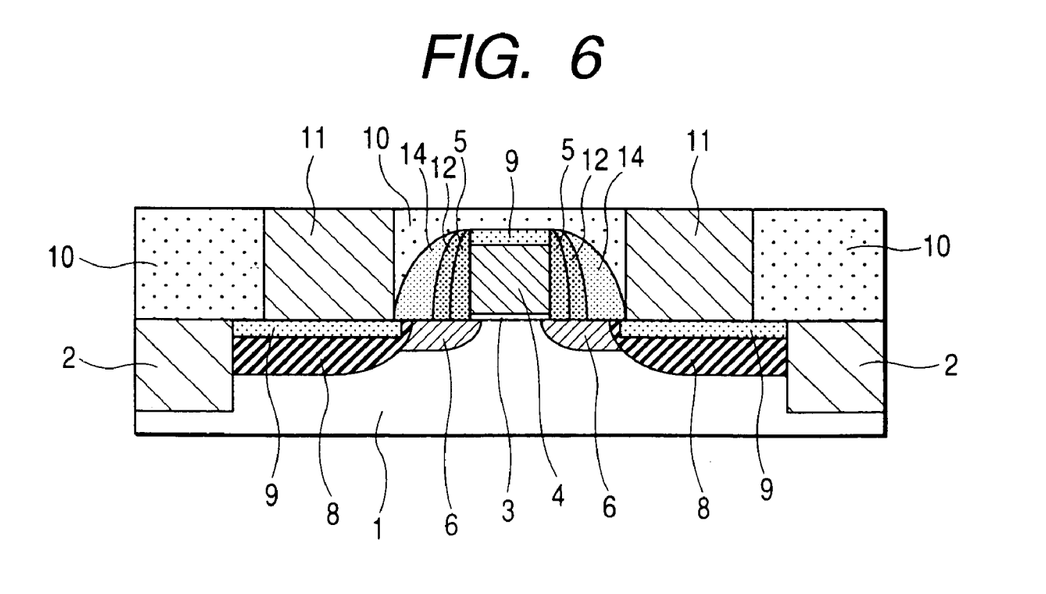
FIG. 6 is a complete cross-sectional diagram showing a MIS field-effect transistor implemented by a second embodiment of the present invention.

Next, a second embodiment is explained by referring to FIG. 6. FIG. 6 is a complete cross-sectional diagram showing a MIS field-effect transistor for a case in which it is necessary to set the width of a side-wall spacer at a value of more than or equal to 15 nm.

Much like the first embodiment explained earlier, a gate dielectric 3 and a gate electrode 4 made of poly-silicon are formed on a silicon substrate 1. Then, a dielectric is deposited on the silicon substrate 1 by adopting typically the CVD technique. The dielectric whose dielectric constant is greater than a silicon-oxide film is then etched back to leave a first side-wall spacer 5 having a width typically in the range 5 nm to 15 nm on the side wall of the gate electrode 4. Examples of such a dielectric are a silicon-nitride film, a silicon film, an aluminum oxide film, a tantalum oxide film, a titanium oxide film, a zirconium dioxide film and a hafnium oxide film. At that time, in order to assure reliability of the device, light oxidation is carried out at a temperature of typically 650° C. prior to the process to stack the first side-wall spacer 5 on the silicon substrate 1 in order to cover the surface of the silicon substrate 1 and the surface of the gate electrode 4 with an extremely thin silicon-oxide film.

Subsequently, a silicon-nitride film whose dielectric constant is small is deposited and then etched back to leave a second side-wall spacer 12. Then, an impurity diffusion layer area 6 is formed by ion implantation of impurities having a predetermined conduction type with the first side-wall spacer 5 and the second side-wall spacer 12 used as masks. Subsequently, in the same way, a further dielectric, a silicon-oxide film in this embodiment, is stacked by adopting typically the CVD technique and then etched back to leave a third side-wall spacer 14. Then, a second impurity diffusion layer area 8 is formed by ion implantation of impurities having a high concentration with the gate electrode, the first side-wall spacer, the second side-wall spacer and the third side-wall spacer 14 used as a mask.

Then, an activation annealing process is carried out on the impurities at a typical temperature of over 1,000° C. Subsequently, on the surface layer of the second impurity diffusion layer area 8 and the surface layer of the gate electrode 4, a metal silicide layer 9 formed. Examples of the metal silicide are titanium silicide, cobalt silicide and nickel silicide. Then, after the metal silicide layer is formed, an interlayer dielectric 10 and wiring electrodes 11 including drain and source electrodes are formed in accordance with a desired circuit technique.

In accordance with the second embodiment, it is possible to assure an effective channel length greater than that of the first embodiment. Thus, the short-channel effect can be suppressed effectively in comparison with the first embodiment. In addition, an inner side wall of the gate electrode 3 is made of a dielectric having a large dielectric constant. Thus, a large driving current can be assured as well. Moreover, the thickness of used side-wall spacers each having a high dielectric constant can be reduced to a required minimum. The remaining side-wall spacers are each formed from a dielectric with a low dielectric constant (a silicon-oxide layer). Thus, an increase in parasitic capacitance can be suppressed.

Figure 7:
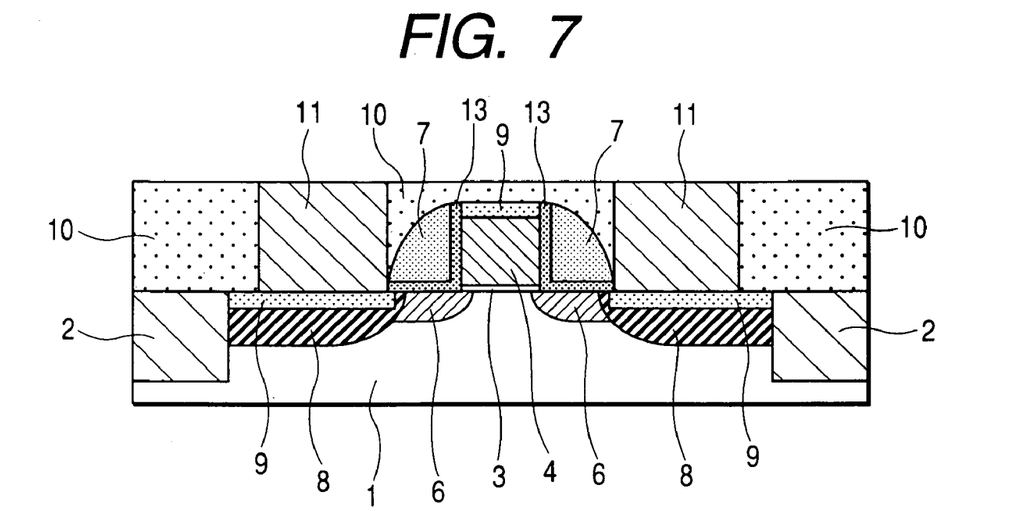
FIG. 7 is a complete cross-sectional diagram showing a MIS field-effect transistor implemented by a third embodiment of the present invention.

FIG. 7 is a complete cross-sectional diagram showing a MIS field-effect transistor implemented by a third embodiment of the present invention. In the case of the third embodiment, a transistor is formed by using a first thin film 13 in place of the first side-wall spacer 5 formed in the first embodiment by carrying out a process to etch back a dielectric. The first thin film 13 is formed by depositing a dielectric, which has a dielectric constant greater than that of a silicon-oxide film, for example, a silicon-nitride film or a titanium-oxide film, by adoption of typically the CVD technique. The first thin film 13 suppresses spreading of the first impurity diffusion layer area 6 into the channel in the horizontal direction. The thickness of the first thin film 13 is determined by the deposit thickness of the dielectric.

Even in the case of the second embodiment employing the first thin film 13 as described above, the short-channel effect of the transistor can be suppressed and the driving current of the transistor can be increased.

Figure 8:
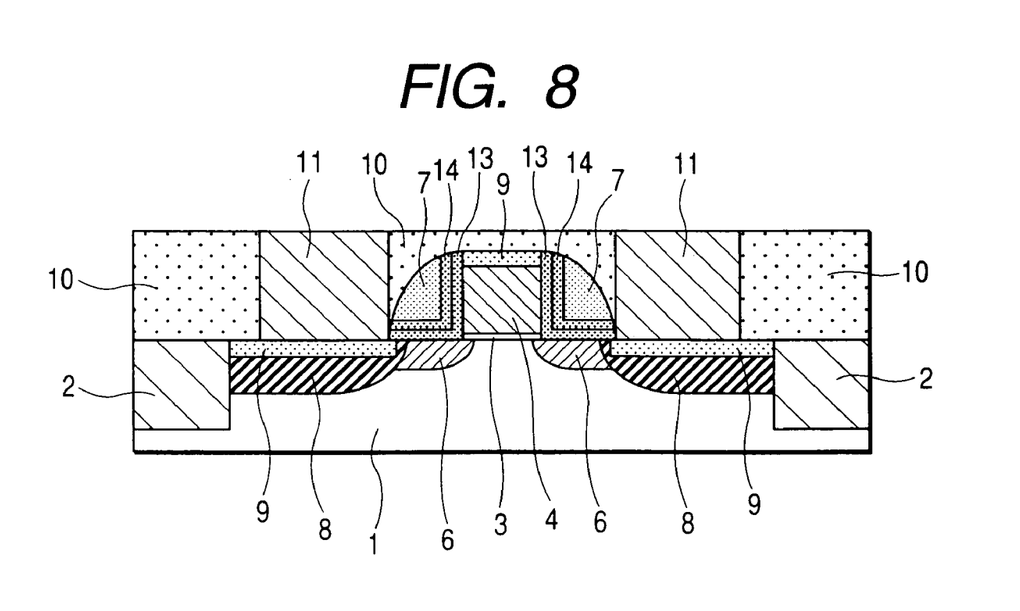
FIG. 8 is a complete cross-sectional diagram showing a MIS field-effect transistor implemented by a fourth embodiment of the present invention.

FIG. 8 is a complete cross-sectional diagram showing a MIS field-effect transistor implemented by a fourth embodiment of the present invention. In the case of the fourth embodiment, a MIS field-effect transistor is formed by using a first thin film 13 and a second thin film 14 in place of respectively the first side-wall spacer 5 and the second side-wall spacer 12, which are each formed in the second embodiment by carrying out a process to etch back a dielectric. The first thin film 13 is formed by depositing a dielectric, which has a dielectric constant greater than that of a silicon-oxide film, for example, a silicon-nitride film or a titanium-oxide film, by adoption of typically the CVD technique. On the other hand, the second thin film 14 is formed by depositing a dielectric, which has a small dielectric constant, i.e. a silicon-oxide film.

The first thin film 13 and the second thin film 14 each suppress spreading of the first impurity diffusion layer area 6 into the channel in the horizontal direction. The thickness of the first thin film 13 and that of the second thin film 14 are each determined by the placing thickness of the dielectric. In this case, as described earlier, it is desirable to form the first thin film 13 with a large dielectric constant at a thickness in the range from 5 nm to 15 nm and to set the thickness of the second film 14 by adjusting the deposit thickness of the dielectric having a small dielectric constant.

In accordance with the fourth embodiment, it is possible to assure an effective channel length greater than that of the first embodiment. Thus, the short-channel effect can be suppressed effectively in comparison with the first embodiment. In addition, an inner side wall of the gate electrode 3 is made of a dielectric having a large dielectric constant. Thus, a large driving current can be assured as well. Moreover, the thickness of used side-wall spacers each having a high dielectric constant can be reduced to a required minimum. The remaining side-wall spacers are each formed from a dielectric with a low dielectric constant (a silicon-oxide layer). Thus, an increase in parasitic capacitance can be suppressed.

Even in the case of the fourth embodiment employing the first thin film 13 and the second film 14 as described above, the short-channel effect of the transistor can be suppressed and the driving current of the transistor can be increased.

Figure 9:
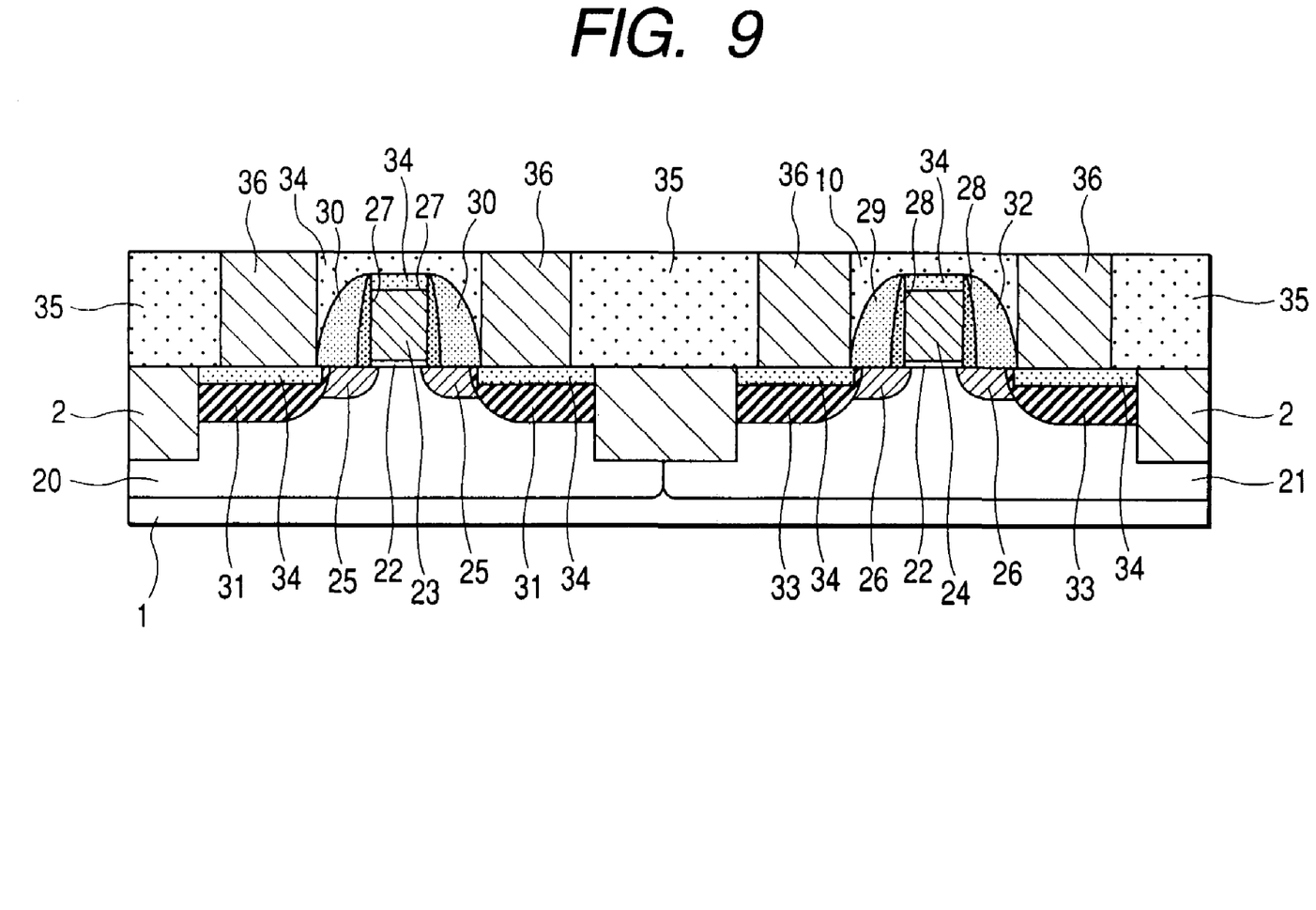
FIG. 9 is a complete cross-sectional diagram showing a MIS semiconductor device implemented by a fifth embodiment of the present invention.

FIG. 9 is a complete cross-sectional diagram showing a MIS field-effect transistor implemented by a fifth embodiment of the present invention. The fifth embodiment is an embodiment wherein an N-channel transistor and a P-channel transistor are fabricated on the same substrate in accordance with the present invention. The fifth embodiment shown in FIG. 9 implements a method of manufacturing a semiconductor device allowing the effective gate length of the N-channel transistor and that of the P-channel transistor to be set independently with each other by combining the first embodiment described earlier with the conventional manufacturing method.

After a P well area 20, an N well area 21 and an element separation field oxide film 2 are formed on a silicon substrate 1, a gate dielectric 22 and gate electrodes 23 and 24, which are made of poly-silicon, are formed.

In this state, for the N-channel transistor, impurities having a predetermined conduction type are introduced in an ion implantation process with the gate electrode 23 used as a mask to form an N− impurity diffusion layer area 25.

Then, a dielectric having a dielectric constant greater than that of a silicon-oxide film, for example, a silicon-nitride film or a titanium-oxide film, is deposited by adoption of typically the CVD technique and etched back to form first side-wall spacers 27 and 28 on the side walls of the gate electrodes 23 and 24 respectively.

In this state, for the P-channel transistor, impurities having a predetermined conduction type are introduced in an ion implantation process with the gate electrode 24 and the first side-wall spacer 28 used as masks to form a P− impurity diffusion layer area 26.

Then, a dielectric, for example, a silicon-oxide film, having a dielectric constant smaller than those of the first side-wall spacers 27 and 28 is deposited by adoption of typically the CVD technique and etched back in the same way to form second side-wall spacers 30 and 32.

In this state, for the N-channel transistor, impurities having a predetermined conduction type are introduced in an ion implantation process with the gate electrode 23, the first side-wall spacer 27 and the second side-wall spacer 30 used as masks to form an N+ impurity diffusion layer area 31.

Then, for the P-channel transistor, impurities having a predetermined conduction type are introduced in an ion implantation process with the gate electrode 24, the first side-wall spacer 28 and the second side-wall spacer 32 used as masks to form a P+ impurity diffusion layer area 33.

Subsequently, an activation annealing process is carried out on the impurities at a typical temperature of over 1,000° C. in a period of time as short as possible. By shortening the thermal budget in this way, desirable suppression of impurity diffusion can be carried out. Subsequently, on the surface layers of the impurity diffusion layer areas 31 and 33 and the surface layers of the gate electrodes 23 and 24, a metal silicide layer 34 is formed. Examples of the metal silicide are titanium silicide, cobalt silicide and nickel silicide. Then, after the metal silicide layer is formed, an interlayer dielectric 35 and wiring electrodes 36 including drain and source electrodes are formed in accordance with a desired circuit technique.

As described above, for the N-channel transistor, impurities having a predetermined conduction type are introduced in anion implantation process with the gate electrode 23 used as a mask to form an N− impurity diffusion layer area 25. For the P-channel transistor, on the other hand, impurities having a predetermined conduction type are introduced in an ion implantation process with the gate electrode 24 and the first side-wall spacer 28 used as masks to form a P− impurity diffusion layer area 26. Thus, it is possible to provide a manufacturing method whereby the effective gate length of the N-channel transistor and that of the P-channel transistor can be set independently with each other. In addition, since a dielectric having a large dielectric constant is used as a material for making an inner side wall of the gate electrode 24, a large driving current can be assured as well. Moreover, the thickness of used side-wall spacers each having a high dielectric constant can be reduced to a required minimum. The remaining side-wall spacers are each formed from a dielectric with a low dielectric constant (a silicon-oxide layer). Thus, an increase in parasitic capacitance can be suppressed.

As described above, in the case of the fifth embodiment, an N-channel transistor is formed by adoption of the conventional method while a P-channel transistor is formed by adoption of the method provided by the first embodiment. It is to be noted, however, that it is also possible to form a P-channel transistor by adoption of the conventional method and to form an N-channel transistor by adoption of the method provided by the first embodiment.

Figure 10:
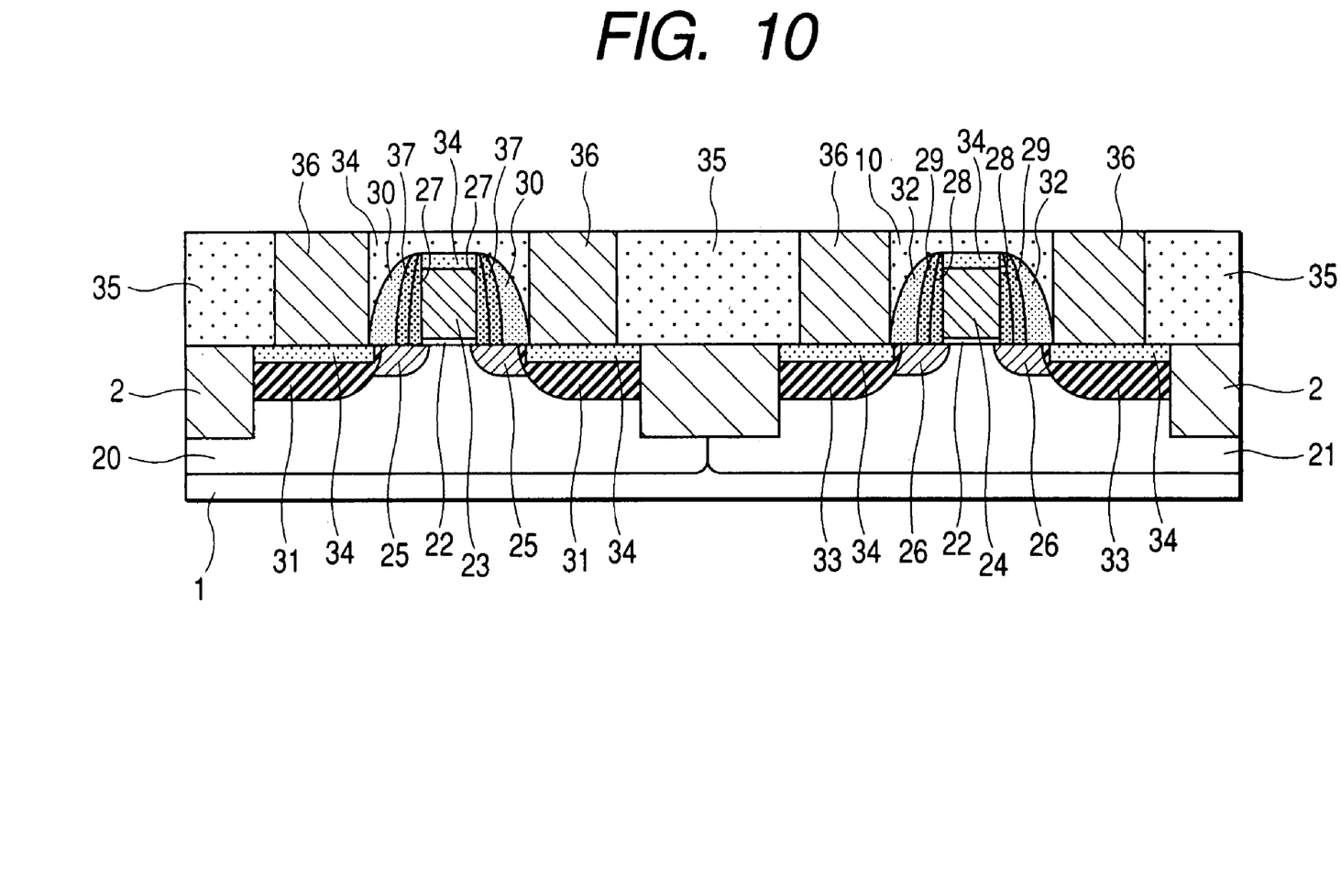
FIG. 10 is a complete cross-sectional diagram showing a MIS semiconductor device implemented by a sixth embodiment of the present invention.

FIG. 10 is a complete cross-sectional diagram showing a MIS field-effect transistor implemented by a sixth embodiment of the present invention. The sixth embodiment is an embodiment wherein an N-channel transistor and a P-channel transistor are fabricated on the same substrate in accordance with the present invention. The sixth embodiment shown in FIG. 10 implements a method of manufacturing a semiconductor device allowing the N-channel transistor and the P-channel transistor to be designed independently with each other by combining the first and second embodiments described earlier.

After a P well area 20, an N well area 21 and an element separation field oxide film 2 are formed on a silicon substrate 1, a gate dielectric 22 and gate electrodes 23 and 24, which are made of poly-silicon, are formed. Then, a dielectric having a dielectric constant greater than that of a silicon-oxide film, for example, a silicon-nitride film or a titanium-oxide film, is deposited by adoption of typically the CVD technique and etched back to form first side-wall spacers 27 and 28 on the side walls of the gate electrodes 23 and 24 respectively. At that time, in order to assure reliability of the device, light oxidation is carried out at a temperature of typically 650° C. prior to the process to stack the first side-wall spacers 27 and 28 on the silicon substrate 1 in order to cover the surface of the silicon substrate 1 and the surfaces of the gate electrodes 23 and 24 with an extremely thin silicon-oxide film.

In this state, for the N-channel transistor, impurities having a predetermined conduction type are introduced in an ion implantation process with the gate electrode 23 and the first side-wall spacer 27 used as masks to form an N− impurity diffusion layer area 25.

Then, a dielectric having a dielectric constant smaller than those of the side-wall spacers 27 and 28, for example, a silicon-oxide film, is deposited by adoption of typically the CVD technique and etched back in the same way to form second side-wall spacers 29 and 37.

In this state, for the P-channel transistor, impurities having a predetermined conduction type are introduced in an ion implantation process with the gate electrode 24, the first side-wall spacer 28 and the second side-wall spacer 29 used as masks to form a P− impurity diffusion layer area 26.

Then, a dielectric having a dielectric constant smaller than those of the side-wall spacers 27 and 28, for example, a silicon-oxide film, is stacked by adoption of typically the CVD technique and etched back in the same way to form third side-wall spacers 30 and 32.

In this state, for the N-channel transistor, impurities having a predetermined conduction type are introduced in an ion implantation process with the gate electrode 23 and the first side-wall spacer 27, the second side-wall spacer 37 and the third side-wall spacer 30 used as masks to form an N+ impurity diffusion layer area 31.

Then, for the P-channel transistor, impurities having a predetermined conduction type are introduced in an ion implantation process with the gate electrode 24 and the first side-wall spacer 28, the second side-wall spacer 29 and the third side-wall spacer 32 used as masks to form a P+ impurity diffusion layer area 33.

Subsequently, an activation annealing process is carried out on the impurities at a typical temperature of over 1,000° C. in a period of time as short as possible. By shortening the thermal budget in this way, desirable suppression of impurity diffusion can be carried out. Then, on the surface layers of the impurity diffusion layer areas 31 and 33 and the surface layers of the gate electrodes 23 and 24, a metal silicide layer 34 is formed. Examples of the metal silicide are titanium silicide, cobalt silicide and nickel silicide. Then, after the metal silicide layer is formed, an interlayer dielectric 35 and wiring electrodes 36 including drain and source electrodes are formed in accordance with a desired circuit technique.

As described above, for the N-channel transistor, impurities having a predetermined conduction type are introduced in an ion implantation process with the gate electrode 23 and the first side-wall spacer 27 used as masks to form an N− impurity diffusion layer area 25. For the P-channel transistor, on the other hand, impurities having a predetermined conduction type are introduced in an ion implantation process with the gate electrode 24, the first side-wall spacer 28 and the second side-wall spacer 29 used as masks to form a P− impurity diffusion layer area 26. Thus, it is possible to provide a manufacturing method whereby the effective gate length of the N-channel transistor and that of the P-channel transistor can be set independently with each other in ranges wider than those provided by the fifth embodiment. In addition, since a dielectric having a large dielectric constant is used as a material for making an inner side wall of the gate electrode 23 and that of the gate electrode 24, a large driving current can be assured as well. Moreover, the thickness of used side-wall spacers each having a high dielectric constant can be reduced to a required minimum. The remaining side-wall spacers are each formed from a dielectric with a low dielectric constant (a silicon-oxide layer). Thus, an increase in parasitic capacitance can be suppressed.

As described above, in the case of the sixth embodiment, an N-channel transistor is formed by adoption of the method provided by the first embodiment while a P-channel transistor is formed by adoption of the method provided by the second embodiment. It is to be noted, however, that it is also possible to form a P-channel transistor by adoption of the method provided by the first embodiment and to form an N-channel transistor by adoption of the method provided by the second embodiment.

Figure 11:
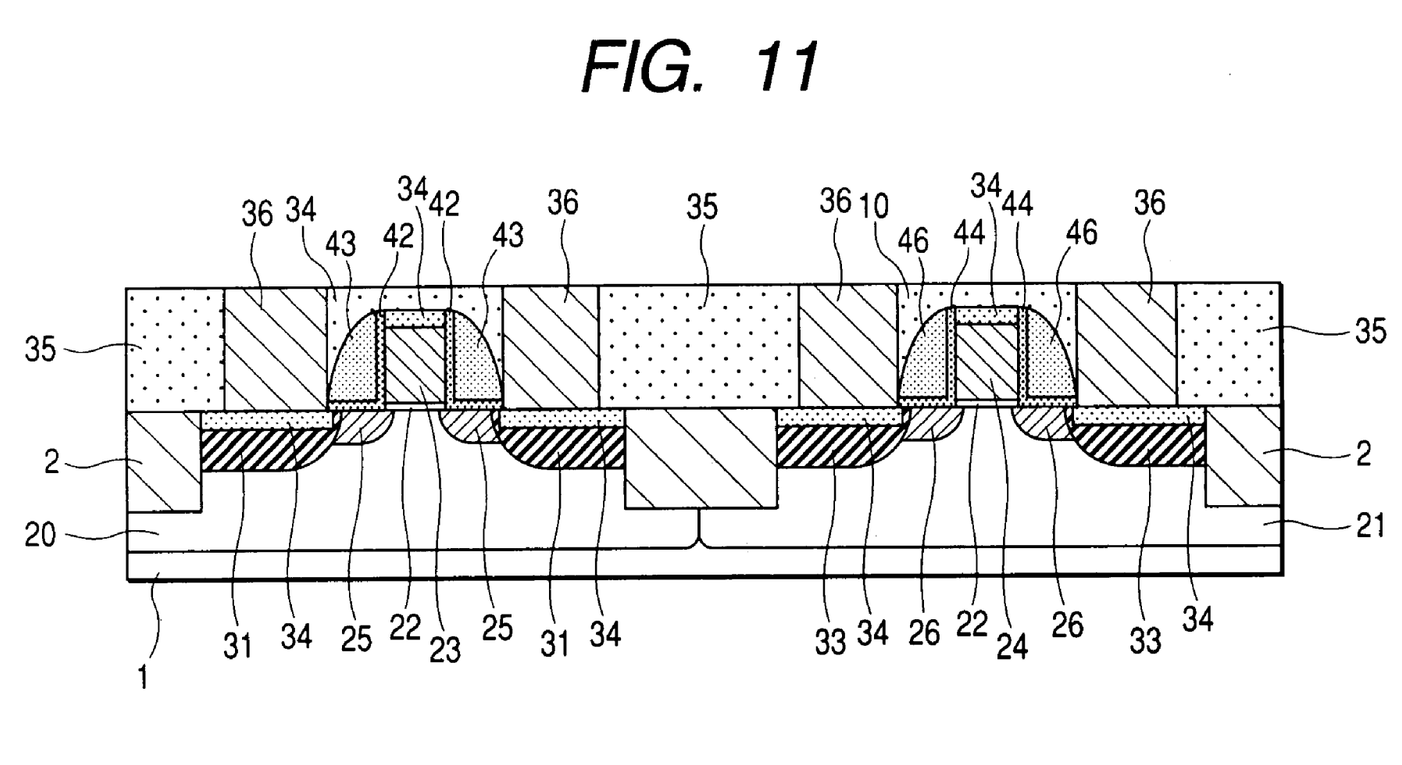
FIG. 11 is a complete cross-sectional diagram showing a MIS semiconductor device implemented by a seventh embodiment of the present invention.

FIG. 11 is a complete cross-sectional diagram showing a MIS field-effect transistor implemented by a seventh embodiment of the present invention. In the case of the seventh embodiment, a MIS field-effect transistor is formed by using first thin films 42 and 44 in place of respectively the first side-wall spacers 27 and 28, which are each formed in the fifth embodiment by carrying out a process to etch back a dielectric. The first thin films 42 and 44 are each formed by depositing a dielectric, which has a dielectric constant greater than that of a silicon-oxide film, for example, a silicon-nitride film or a titanium-oxide film, by adoption of typically the CVD technique.

As described above, for the N-channel transistor, impurities having a predetermined conduction type are introduced in an ion implantation process with the gate electrode 23 used as a mask to form an N− impurity diffusion layer area 25. For the P-channel transistor, on the other hand, impurities having a predetermined conduction type are introduced in an ion implantation process with the gate electrode 24 and the first thin film 44 used as masks to form a P− impurity diffusion layer area 26. Thus, it is possible to provide a manufacturing method whereby the effective gate length of the N-channel transistor and that of the P-channel transistor can be set independently with each other as is the case with the fifth embodiment. In addition, since a dielectric having a large dielectric constant is used as a material for making an inner side wall of the gate electrode 23 and that of the gate electrode 24, a large driving current can be assured as well. Moreover, the thickness of used side-wall spacers each having a high dielectric constant can be reduced to a required minimum. The remaining side-wall spacers are each formed from a dielectric with a low dielectric constant (a silicon-oxide layer). Thus, an increase in parasitic capacitance can be suppressed.

As described above, in the case of the seventh embodiment, an N-channel transistor is formed by adoption of the conventional method while a P-channel transistor is formed by adoption of the method provided by the third embodiment. It is to be noted, however, that it is also possible to form a P-channel transistor by adoption of the conventional method and to form an N-channel transistor by adoption of the method provided by the third embodiment.

Figure 12:
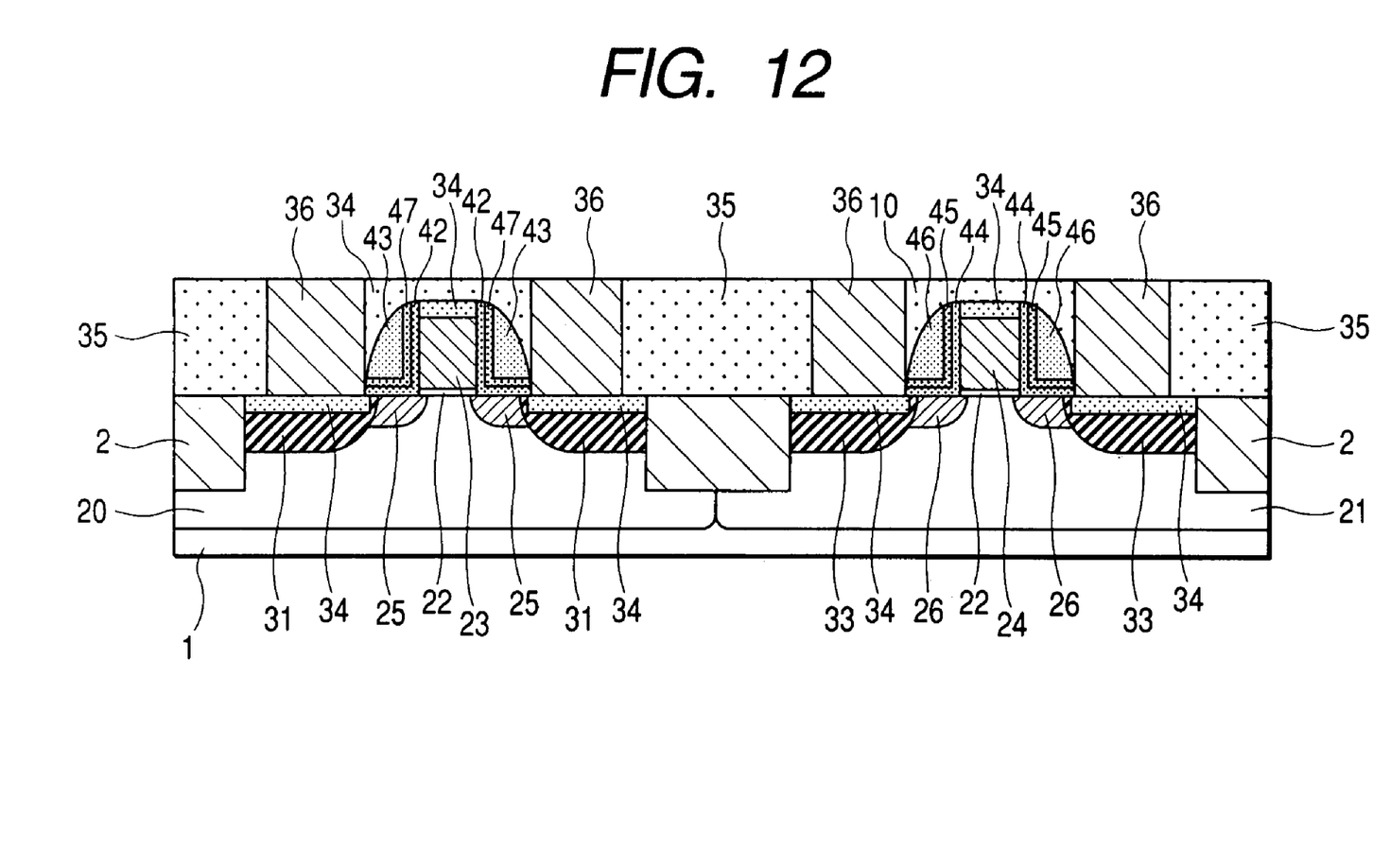
FIG. 12 is a complete cross-sectional diagram showing a MIS semiconductor device implemented by an eighth embodiment of the present invention.

FIG. 12 is a complete cross-sectional diagram showing a MIS field-effect transistor implemented by an eighth embodiment of the present invention. In the case of the eighth embodiment, a MIS field-effect transistor is formed by using first thin films 42 and 44 as well as second thin films 45 and 47 in place of respectively the first side-wall spacers 27 and 28 and the second side-wall spacers 29 and 37, which are each formed in the sixth embodiment by carrying out a process to etch back a dielectric. The first thin films 42 and 44 are each formed by depositing a dielectric, which has a dielectric constant greater than that of a silicon-oxide film, for example, a silicon-nitride film or a titanium-oxide film, by adoption of typically the CVD technique. On the other hand, the second thin films 45 and 47 are each formed by depositing a silicon-oxide film, which is a dielectric having a small dielectric constant.

As described above, for the N-channel transistor, impurities having a predetermined conduction type are introduced in an ion implantation process with the gate electrode 23 and the first thin film 42 used as masks to form an N− impurity diffusion layer area 25. For the P-channel transistor, on the other hand, impurities having a predetermined conduction type are introduced in an ion implantation process with the gate electrode 24, the first thin film 44 and the second thin film 45 used as masks to form a P− impurity diffusion layer area 26. Thus, it is possible to provide a manufacturing method whereby the effective gate length of the N-channel transistor and that of the P-channel transistor can be set independently with each other in ranges wider than those provided by the fifth embodiment. In addition, since a dielectric having a large dielectric constant is used as a material for making an inner sidewall of the gate electrode 23 and that of the gate electrode 24, a large driving current can be assured as well. Moreover, the thickness of used side-wall spacers each having a high dielectric constant can be reduced to a required minimum. The remaining side-wall spacers are each formed from a dielectric with a low dielectric constant (a silicon-oxide layer). Thus, an increase in parasitic capacitance can be suppressed.

As described above, in the case of the eighth embodiment, an N-channel transistor is formed by adoption of the method provided by the third embodiment while a P-channel transistor is formed by adoption of the method provided by the fourth embodiment. It is to be noted, however, that it is also possible to form a P-channel transistor by adoption of the method provided by the third embodiment and to form an N-channel transistor by adoption of the method provided by the fourth embodiment.

As described above, in accordance with the present invention, a MIS field-effect transistor is formed by forming a side-wall spacer from a dielectric having a high dielectric constant and then forming an impurity diffusion layer area with the side-wall spacer used as a mask edge. Thus, the short-channel effect can be suppressed sufficiently and suppression of the source-drain parasitic resistance can be achieved. As a result, a large driving current can be obtained as well. In this case, the side wall of the side-wall spacer having the high dielectric constant has an optimum film thickness in the range from 5 nm to 15 nm, which is required for achieving a large driving current. On the other hand, a side-wall spacer on the outer side is made of a silicon-oxide film, which is a dielectric having a low dielectric constant. Thus, the parasitic capacitance can be suppressed to a small value. As a result, it is possible to produce a miniaturized MIS field-effect transistor capable of operating at a high speed.

In addition, in the case of a MIS field-effect transistor formed to comprise an N-channel transistor and a P-channel transistor, it is possible to provide a method of manufacturing the MIS field-effect transistor whereby the effective gate lengths of N-channel transistor and the P-channel transistor can be designed independently with each other on the same substrate.

What is claimed is:

1. A MIS-semiconductor-device manufacturing method comprising the steps of:

forming a gate dielectric on a semiconductor substrate of a first conduction type;

forming a gate electrode on a top surface of said gate dielectric;

forming a first side-wall spacer on a side wall of said gate electrode;

forming a second side-wall spacer by placing on said first side-wall spacer;

forming a first impurity area having a second conduction type opposite to said first conduction type by introduction of impurities into said semiconductor substrate with said gate electrode, said first side-wall spacer and said second side-wall spacer as a mask;

forming a third side-wall spacer by placing on said second side-wall spacer;

forming a second impurity area having an impurity concentration higher than an impurity concentration of said first impurity area by introduction of impurities into said semiconductor substrate with said gate electrode, said first side-wall spacer, said second side-wall spacer and said third side-wall spacer as a mask; and carrying out a heat treatment so that one edge of said gate electrode overlaps on said first impurity area, wherein said first side-wall spacer is made of a material having a relative dielectric constant greater than that of said second side-wall spacer and said third side-wall spacer.

2. A MIS-semiconductor-device-manufacturing method according to claim 1, wherein said first side-wall spacer is made of a material selected from the group consisting of silicon nitride, silicon, aluminum oxide, tantalum oxide, titanium oxide, zirconium dioxide and hafnium oxide.

3. A MIS-semiconductor-device-manufacturing method according to claim 1, wherein said first side-wall spacer is made of a thin film having a fixed thickness.

4. A MIS-semiconductor-device-manufacturing method according to claim 1, wherein said second side-wall spacer is made of a thin film having a fixed thickness.

5. A MIS-semiconductor-device-manufacturing method according to claim 1, wherein each of said first side-wall spacer and said second side-wall spacer is made of a thin film having a fixed thickness.

6. A MIS-semiconductor-device-manufacturing method according to claim 1, further comprising the step of forming silicon-oxide film on the surface of said semiconductor substrate and the surface of said gate electrode before forming said first side-wall spacer.

7. A MIS-semiconductor-device-manufacturing method according to claim 1, wherein said first side-wall spacer has a width in the range from 5 nm to 15 nm.

* * * * *